(12) United States Patent
Willingham et al.

(10) Patent No.: US 7,723,867 B2
(45) Date of Patent: May 25, 2010

(54) POWER GATING OF CIRCUITS

(75) Inventors: David John Willingham, Ilford (GB); Andrew John Sowden, Cambridge (GB)

(73) Assignee: ARM Limited, Cambridge (GB)

( * ) Notice: Subject to any disclaimer, the term of this patent is extended or adjusted under 35 U.S.C. 154(b) by 357 days.

(21) Appl. No.: 11/806,258

(22) Filed: May 30, 2007

(65) Prior Publication Data
US 2008/0297063 A1 Dec. 4, 2008

(51) Int. Cl.
*H02J 1/00* (2006.01)
*H02J 3/00* (2006.01)

(52) U.S. Cl. ........................................ 307/80
(58) Field of Classification Search .................... 307/87, 307/12, 18, 80
See application file for complete search history.

(56) References Cited
U.S. PATENT DOCUMENTS
2002/0135235 A1* 9/2002 Winick et al. ................. 307/87

* cited by examiner

*Primary Examiner*—Albert W Paladini
*Assistant Examiner*—Carlos Amaya
(74) *Attorney, Agent, or Firm*—Nixon & Vanderhye P.C.

(57) ABSTRACT

A control device for controlling power supplied to circuitry is disclosed. The circuitry comprises a plurality of portions, each of said plurality of circuit portions being arranged between a first voltage level source and a second voltage level source, said first and second voltage level sources being adapted to output different voltage levels; said control device being adapted to control power supplied to each of said plurality of circuit portions. The control device comprises: a plurality of power switching devices corresponding to said plurality of circuit portions, each power switching device being arranged between said first voltage level source and a corresponding circuit portion such that when one of said plurality of power switching devices is switched on a voltage level close to a voltage level output by said first voltage level source is supplied to said corresponding circuit portion and said corresponding circuit portion is powered up and when switched off said corresponding circuit portion is isolated from said first voltage level source and said corresponding circuit portion is powered down, said control device further comprising: at least one voltage equalization switching device arranged between two power switching devices to provide a low resistance path between said two power switching devices when they are both turned on and to isolate said two power switching devices from each other when either are turned off.

18 Claims, 6 Drawing Sheets

POWER GATING OF CIRCUITS

BACKGROUND OF THE INVENTION

1. Field of the Invention

The field of the invention relates to data processing and in particular to power gated circuitry.

2. Description of the Prior Art

It is known to provide integrated circuits with one or more virtual power rails and one or more virtual ground rails. These virtual rails are selectively connected or disconnected to the main power rails and the main ground rails respectively by header transistors and footer transistors. This technique is useful in reducing power consumption when a block/domain within an integrated circuit is not required to be active and accordingly can be powered down and isolated from the power supply and the ground by the use of these header and/or footer transistors. These header and/or footer devices are selected such that when they are switched off they have a high resistance and thus, a low leakage current. This is generally done by selecting devices with a high threshold voltage.

Conventionally when a circuit is power gated in this way, it may be necessary to divide the circuit into portions that can be individually powered up in a sequential fashion to avoid a large in-rush current on power up. Such a current can cause physical damage to the circuit or may cause sensitive circuitry in the proximity to be perturbed by the drop in voltage that such a current produces.

Although the division of the circuit in this way addresses the in-rush current problem, it brings its own drawbacks. In particular, the provision of what are in effect several isolated virtual power supplies can cause the circuit to be more sensitive to manufacturing defects and these can lead to variations in the performance of the circuit portions power gated by different devices. This is due to differences in the power gating devices leading to differences in the voltage and/or current levels supplied to the circuit portions. In particular, if the supply and demand on each isolated virtual power supply has not been correctly balanced the performance of the power-gated circuit portions may suffer as they may not be supplied with sufficient current to function optimally.

FIG. 1a shows an integrated circuit 5 according to the prior art. The integrated circuit 5 comprises a first voltage rail 10 connected to a positive voltage source Vdd and a second voltage rail 20 connected to Vss. Processing circuitry 30 is arranged between these two voltage rails and is powered by them. Circuitry 30 is divided into separate portions 32 and 34 which are each individually power gated by PMOS power transistors 42 and 44 respectively. Although, in this figure only two portions of the circuitry 30 are shown it will be clear to a skilled person that in general there are many portions. Integrated circuit 5 also comprises control logic 50 for controlling the power gating transistors 42 and 44 which act to supply power to their respective circuit portions when on and to isolate them from the voltage source Vdd and thereby turn them off when switched off. Thus, these power transistors can be used to turn the portions of the circuit on and off individually and thereby save power when these portions of the circuitry 30 are not being used. Power gating PMOS transistors are used as these have a high threshold voltage and therefore low leakage current.

Circuitry 30 is divided into portions which are each separately controlled to provide some control over the current flow that will occur when the circuitry 30 is switched on. If circuitry 30 is relatively large and is all switched on at once then there is a large in-rush current which can cause problems to individual devices, can cause a droop in the voltage rail Vdd and can potentially effect other nearby circuits. Thus, the switching on of these circuits is controlled such that different portions are switched on one after the other therefore limiting the in-rush current.

FIG. 2a shows the integrated circuit 5 of FIG. 1a in layout form. It shows the various layers and the contacts laid down on the silicon used to produce this circuit.

In the very different field of sense amplifiers where a circuit is balanced such that it is sensitive to small changes in say voltage, differences in manufacturing tolerances of the devices forming the sense amplifier can lead to the device not being well balanced. To address this problem a voltage equalisation device may be used between the two balanced devices, this acts to ensure that pairs of wires within a critical circuit are held closer to the same voltage than might be obtained if the equalisation device were not present.

SUMMARY OF THE INVENTION

A first aspect of the present invention provides a control device for controlling power supplied to circuitry, said circuitry comprising a plurality of portions, each of said plurality of circuit portions being arranged between a first voltage level source and a second voltage level source, said first and second voltage level sources being adapted to output different voltage levels; said control device being adapted to control power supplied to each of said plurality of circuit portions, said control device comprising: a plurality of power switching devices corresponding to said plurality of circuit portions, each power switching device being arranged between said first voltage level source and a corresponding circuit portion such that when one of said plurality of power switching devices is switched on a voltage level close to a voltage level output by said first voltage level source is supplied to said corresponding circuit portion and said corresponding circuit portion is powered up and when switched off said corresponding circuit portion is isolated from said first voltage level source and said corresponding circuit portion is powered down, said control device further comprising: at least one voltage equalisation switching device arranged between two power switching devices to provide a low resistance path between said two power switching devices when they are both turned on and to isolate said two power switching devices from each other when either are turned off.

One potential problem that arises when a circuit is divided into portions that are each separately controlled by different power switching devices is that manufacturing differences between the different power switching devices can lead to different voltage levels and currents being available to the different portions of the circuit and this can lead to different operational characteristics. Furthermore, in some cases the manufacturing defects of one of the power switching devices may be catastrophic and may mean that that portion of the circuit can no longer function meaning that the chip will no longer work. The provision of a voltage equalisation switching device arranged between two of the power switching devices that is adapted to provide a low resistance path when both are on and yet provide a high resistance path when either one or both of them are switched off means that when they are both on any differences in their characteristics can be compensated for to some extent by current flowing through the equalisation device. Furthermore, if one of them has a catastrophic defect then voltage can still be supplied to the portion of the circuit connected to this power switching device via the voltage equalisation device. Thus, a single manufacturing defect which previously might have had catastrophic effects will have a much reduced or even negligible impact on the performance of the device provided neighboring devices can supply enough current.

It should be noted that the voltage equalisation devices have the disadvantage that an extra device is required and this will occupy more area.

In some embodiments, said control device is responsive to a power down signal to switch said plurality of power switching devices off at substantially a same time and is responsive to a power up signal to sequentially switch said power switching devices on, such that said power switching devices are switched on one after another in a predetermined switch on cycle.

Although, the control device can be used to control the power supply to different portions of the circuit in a number of ways, in some embodiments it is used to switch off all portions of the circuit at the same time and power them up sequentially. The sequential powering up of the different portions of the circuit reduces the in-rush current that would occur if they were all powered up together. Thus, the circuit can be powered up in a controlled manner and problems with in-rush current and resulting voltage drop from the voltage source can be reduced.

In some embodiments, said control device further comprises a plurality of voltage equalisation switching devices, said plurality of voltage equalisation switching devices being arranged between power switching devices temporally adjacent to each other in said switch on cycle.

Although, even one voltage equalisation switching device may improve the performance of the control device, a plurality of voltage equalisation switching devices can be used to improve the performance still further particularly if they are arranged between power switching devices that are temporally adjacent to each other in the switch on cycle. This enables voltage equalisation to occur immediately at switch on.

In some embodiments, said power switching devices temporally adjacent to each other in said switch on cycle are arranged physically adjacent to each other within said control device.

Although, the power switching devices can be arranged physically in any order, it may be advantageous to arrange them such that the ones that switch on temporally adjacent to each other are physically adjacent to each other also. This arrangement may allow for a simpler implementation of the voltage equalisation devices.

In some embodiments, said control device is arranged such that a control signal for switching a power switching device is also sent to a voltage equalisation switching device connecting said power switching device to a power switching device that switches on immediately prior to said power switching device in said switch on cycle, such that said voltage equalisation switching device switches at substantially a same time as said power switching device, thereby providing a low resistance path between power switching devices that are switched on.

The use of a single control signal to control both the switch on of a power switching device and its associated voltage equalisation device allows for the voltage equalisation to be added to the circuit with no extra complexity in power-gating control logic.

In some embodiments said power switching devices and voltage equalisation devices are the same type of switching devices.

As the voltage equalisation and power switching devices are both switching devices they can be the same type of device. This may allow them to be added as shared and/or multi-fingered devices within the layout of the power-gating devices, and can mean that the addition of a voltage equalisation switching device only requires one or two additional fingers.

In some embodiments said power switching device comprises a power transistor.

Although the power switching device can be a number of things in some embodiments it comprises a power transistor.

Power transistors are particularly well adapted for turning portions of circuits on and off having a high threshold voltage and thereby reducing leakage currents.

In some embodiments, said power transistor comprises a PMOS transistor and said first voltage level source provides a higher level than said second voltage level source.

If the power switching devices are header devices then PMOS transistors form good power switching devices.

In some embodiments said voltage equalisation switching device comprises a PMOS transistor.

PMOS transistors also make effective voltage equalisation switching devices. Using the same devices for the power transistors and the equalisation switching devices makes for a circuit that is easy to design and build. The voltage equalisation devices can be implemented in a relatively simple manner with an efficient use of space.

In some embodiments, said power transistor is an NMOS transistor and said first voltage level source provides a lower voltage level than said second voltage level.

If the power switching device is a footer device then NMOS transistors can be used. In such a case, it may be advantageous if the voltage equalisation switching device is also an NMOS transistor.

In some embodiments, said control device comprises a further plurality of power switching devices corresponding to said plurality of circuit portions, each of said further plurality of power switching devices being arranged between said second voltage level source and a corresponding circuit portion such that when one of said further plurality of power switching devices is switched on a voltage level close to a voltage level output by said second voltage level source is supplied to said corresponding circuit portion and if a corresponding power transistor connected between said first voltage level source and said circuit portion is switched on said corresponding circuit portion is powered up and when one of said further power switching devices is switched off said corresponding circuit portion is isolated from said second voltage level source and said corresponding circuit portion is powered down, said control device further comprising: at least one voltage equalisation switching device arranged between two of said further power switching devices to provide a low resistance path between said two further power switching devices when they are both turned on and to isolate said two further power switching devices from each other when either are turned off.

It may be advantageous to use both header and footer devices to turn selected portions of the circuit on and off. This is particularly so where leakage current is an important issue as using both devices decreases leakage current during the power down stage. In such a case, it is advantageous to use voltage equalisation switching devices with both the header and footer power switching devices.

A second aspect of the present invention provides an integrated circuit comprising a first voltage source and a second voltage source, circuitry arranged between said first and second voltage sources, said circuitry comprising a plurality of portions, and a control device according to a first aspect of the present of invention of controlling power supply to said plurality of circuit portions.

In an embodiment of the present invention said control device is responsive to a power down signal to switch said plurality of power switching devices off at substantially a same time and is responsive to a power up signal to sequentially switch said power switching devices on, such that said power switching devices are switched on one after another in a predetermined switch on cycle, said control device further comprising a plurality of voltage equalisation switching devices, said plurality of voltage equalisation switching devices being arranged between power switching devices temporally adjacent to each other in said switch on cycle wherein said power switching devices temporally adjacent to each other in said switch on cycle are arranged physically adjacent to each other within said control device and said corresponding circuit portions are arranged physically adjacent to each other within said circuitry.

Although, the plurality of circuit portions can be switched on in any order, in some embodiments adjacent ones are switched on one after the other. This is advantageous when building the voltage equalisation switching devices as they can then link physically adjacent power switching devices which makes their manufacture simpler.

In some embodiments, said circuitry comprises an SRAM wherein each of said plurality of circuit portions comprise at least one column of said SRAM.

The circuitry can comprise a number of different things, it may for example comprise SRAM where each column of the SRAM is powered down individually.

A third aspect of the invention provides a method of controlling power supplied to circuitry, said circuitry comprising a plurality of portions, each of said plurality of circuit portions being arranged between a first voltage level source and a second voltage level source, said first and second voltage level sources being adapted to output different voltage levels; said method comprising: controlling a plurality of power switching devices corresponding to said plurality of circuit portions, each power switching device being arranged between said first voltage level source and a corresponding circuit portion, to turn on and thereby power up said corresponding circuit portion or to turn off and thereby power down said corresponding circuit portion; and controlling at least one voltage equalisation switching device arranged between two power switching devices to provide a low resistance path between said two power switching devices when they are both turned on and to isolate said two power switching devices from each other when either are turned off.

A fourth aspect of the present invention provides a means for controlling power supplied to circuitry, said circuitry comprising a plurality of portions, each of said plurality of circuit portions being arranged between a first voltage level source and a second voltage level source, said first and second voltage level sources being adapted to output different voltage levels; said means for controlling being for controlling power supplied to each of said plurality of circuit portions, and comprising: a plurality of power switching means corresponding to said plurality of circuit portions for switching said plurality of circuit portions on or off, each power switching means being arranged between said first voltage level source and a corresponding circuit portion such that when one of said plurality of power switching means is switched on a voltage level close to a voltage level output by said first voltage level source is supplied to said corresponding circuit portion and said corresponding circuit portion is powered up and when switched off said corresponding circuit portion is isolated from said first voltage level source and said corresponding circuit portion is powered down, said control means further comprising: at least one voltage equalisation switching means arranged between two power switching devices for providing a low resistance path between said two power switching means when they are both turned on and for isolating said two power switching means from each other when either are turned off.

The above, and other objects, features and advantages of this invention will be apparent from the following detailed description of illustrative embodiments which is to be read in connection with the accompanying drawings.

BRIEF DESCRIPTION OF THE DRAWINGS

FIG. 2a shows a physical implementation of the circuit of FIG. 1a;

DESCRIPTION OF THE PREFERRED EMBODIMENTS

Figure 1A:
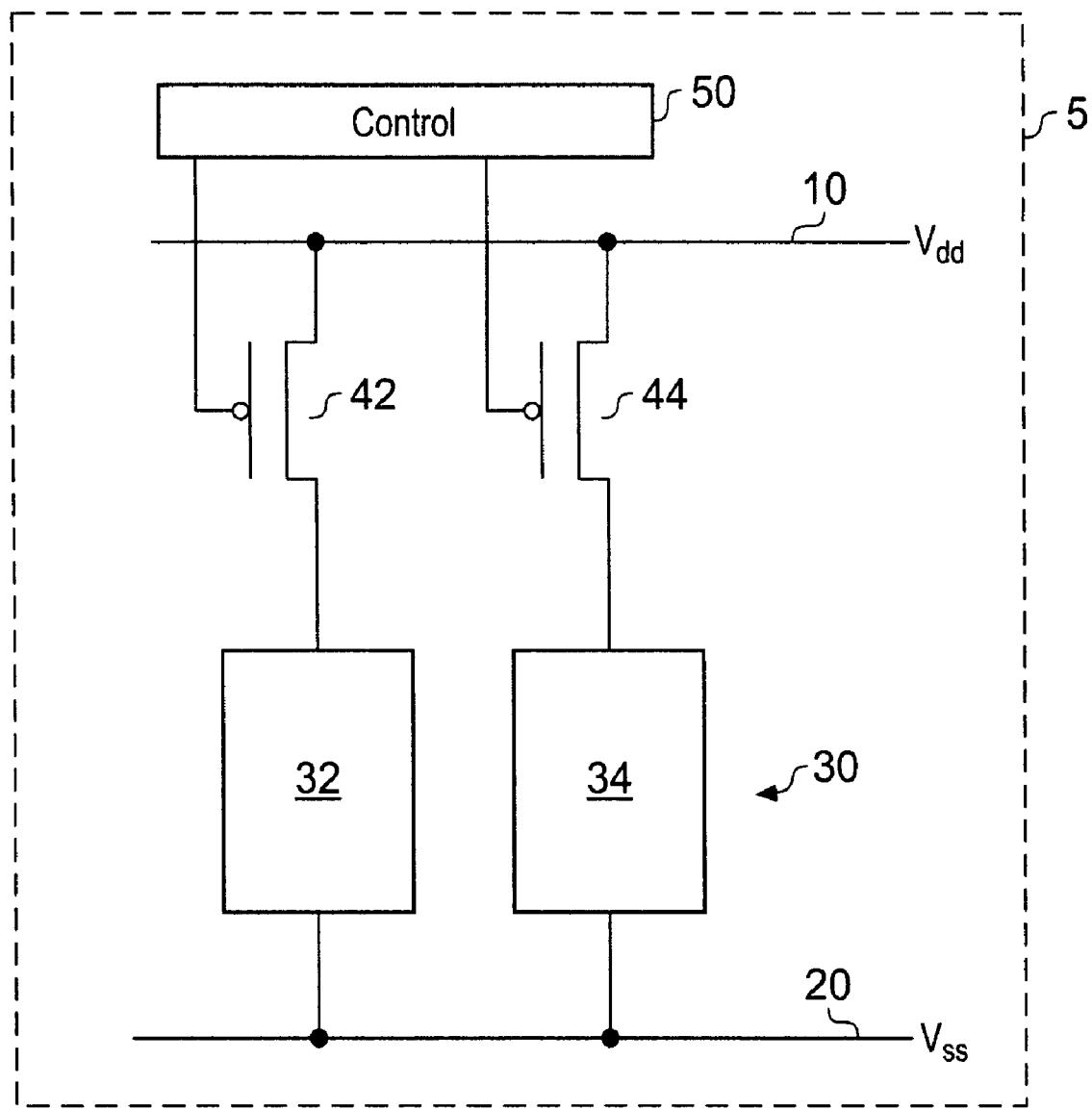
FIG. 1a shows a power gated circuit according to the prior art.
Figure 1B:
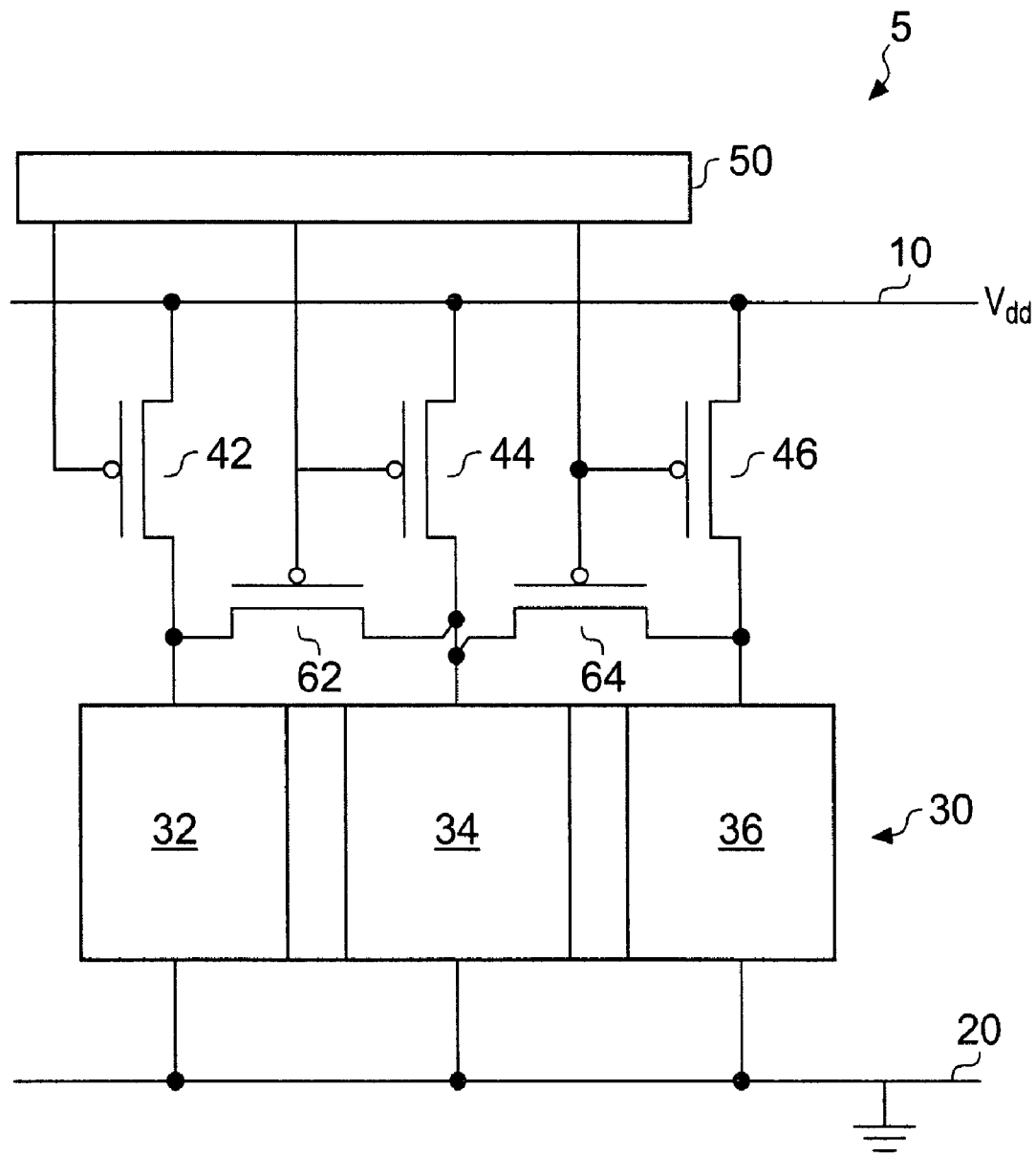
FIG. 1b shows a similar power gated circuit according to an embodiment of the present invention.

FIG. 1b shows an integrated circuit 5 comprising control logic 50 operable to control the power gating to circuitry 30 which comprises different portions which are individually power gated. Although three portions are shown here it should be clear to a skilled person that there could be many portions the number of portions that the circuit is divided into depending on the size of the circuit and the acceptable size of the in-rush current. An integrated circuit 5 of FIG. 1b is similar to the integrated circuit 5 of FIG. 1a with corresponding features having the same reference numerals. Thus, circuitry 30 is powered by voltage rails 10 and 20 and each circuit portion 32, 34, 36 is individually power gated by respective power transistors 42, 44 and 46 which are controlled by control logic 50. Each of the power transistors have their source and bulk terminals connected to the circuit's main positive power supply Vdd with the gate terminal connected to the power gating logic 50. This logic acts to turn these devices off simultaneously but turns them on sequentially to avoid a high in-rush current. The drain terminal of each of these devices forms separate virtual power supplies which are then used to supply current to the circuit portions.

In addition to the power gating transistors 42, 44, 46 there are equalisation transistors 62 and 64 which are connected between the virtual power supplies and act to provide an additional path through which current can flow. These devices are connected such that the bulk terminal of each device is connected to the circuit's main positive power supply Vdd, and thus, shared with the bulk terminals of power gating transistors 42, 44, 46. The gate terminals are connected to the same power control circuit 50 as the power gating transistors and thus, they are switched on and off together.

Thus, in a device having n separate virtual power supplies there would be n-1 equalisation devices.

In the device shown there are three power gating transistors 42, 44, 46 and two equalisation devices 62, 64. When power control logic 50 turns the power off it turns all power gating transistors 42, 44, 46 and equalisation devices 62 and 64 off simultaneously. At this point, current is impeded from flowing from the high voltage rail Vdd to the circuit portions 32, 34, 36 and thus, these are switched off. When circuitry 30 is to be turned on individual circuit portions are turned on sequentially to avoid a high in-rush current. Thus, a control signal is initially sent to power gating transistor 42 to switch this on. At this point a conducting path is provided through power transistor 42 from the high voltage rail to circuit portion 32 and current can flow and power this circuit portion. The next circuit portion to be turned on is portion 34 and a control signal is sent to power gating transistor 44 to turn this power transistor on. This signal is sent simultaneously to equalisation device 62 thus, as power transistor 44 switches on so does equalisation device 62. This in effect provides two paths from high voltage rail 10 to circuit portion 34 and current can be supplied via power transistor 44 or via power transistor 42 and equalisation device 62. Furthermore, there is also a path to circuit portion 32 provided via power transistor 44 and equalisation device 62. Thus, if either of power gating transistors 42 or 44 have some manufacturing defect and do not provide a low resistance path then this can be compensated for by the additional paths provided through the other power transistor and the equalisation device.

The next portion of the circuit to be switched on is portion 36, and thus a control signal is sent from control logic 50 to power gating device 46 and simultaneously to equalisation device 64. These two devices are then turned on at substantially the same time and circuit portion 36 is supplied with power via power transistor 46 and potentially also via power transistor 44 and equalisation device 64 and power transistor 42 and equalisation device 62. Thus, many potential paths are provided to the different circuit portions and differences in manufacturing tolerances of the individual transistors can be compensated for. This clearly has the cost of an additional n-1 transistors. However, as can be seen from FIG. 2b below these can be provided efficiently without too great a cost on area.

In some embodiments, it may be advantageous to provide separate connections to the bulk terminals, to allow the power gating and equalisation devices to be back-biased. Back-biasing involves the bulk terminal (not shown in FIG. 1) of the devices to be connected to a rail that is more positive than Vdd (or in the case of NMOS transistors more negative than Vss) when the device is switched off. This has the advantage of allowing the threshold of the devices to be adjusted in order to reduce the leakage current further, but the disadvantage of making the circuit more complex to build, as it requires an additional voltage source and control.

Figure 2A:
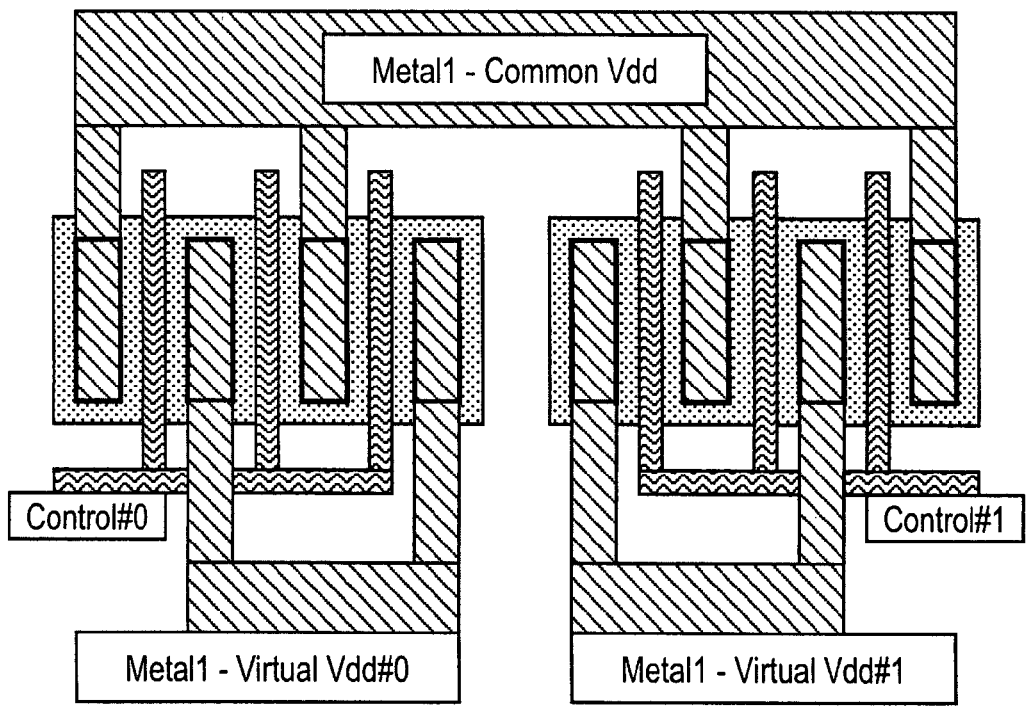
Figure 2B:
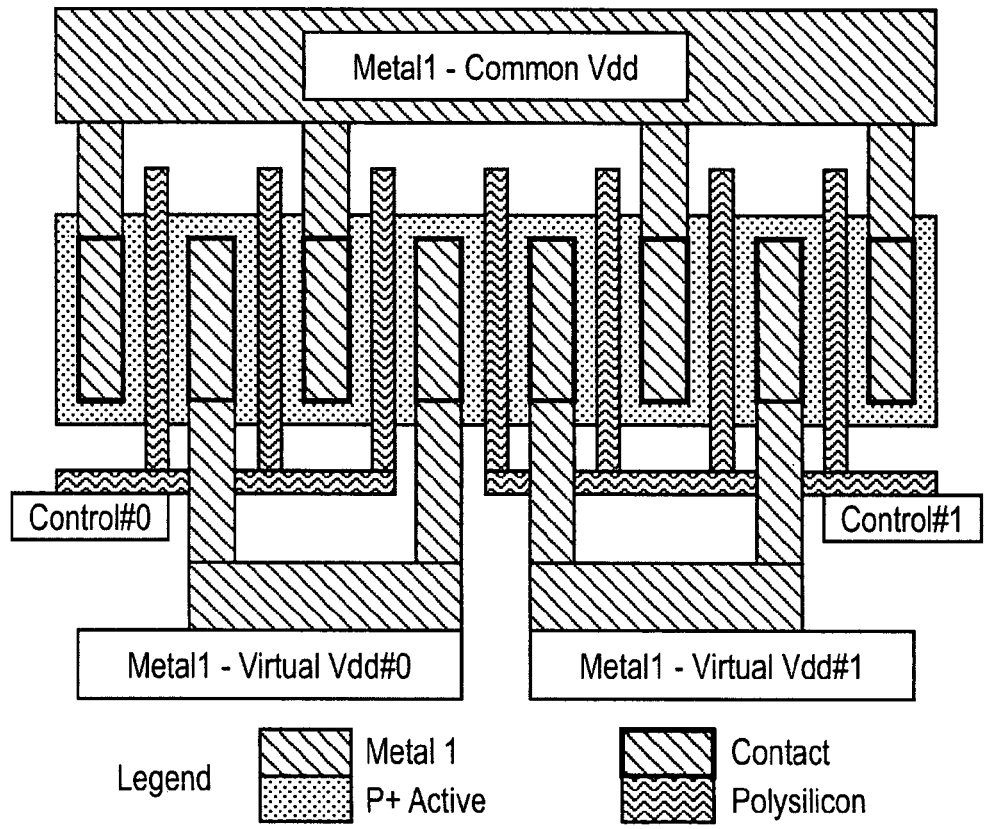
FIG. 2b shows a physical implementation of a portion of the circuit of FIG. 1b.

FIG. 2b shows a physical implementation or layout of a portion of the device of FIG. 1b. That is, the portion having power transistors 42 and 44, equalisation device 62 and circuit portions 32 and 34. FIG. 2a shows a prior art device corresponding to the device shown in FIG. 1a. As can be seen the extra equalisation device of FIGS. 1b and 2b (when compared to FIGS. 1a and 2a) can be provided with very few additional layers. In this case adjacent devices are sequentially switched and the equalisation occurs between adjacent devices. The use of the same type of devices, in this case PMOS transistors, for both power gating and equalisation and the switching of adjacent devices allows the additional device to be added by adding just a single additional finger in the layout.

Figure 3:
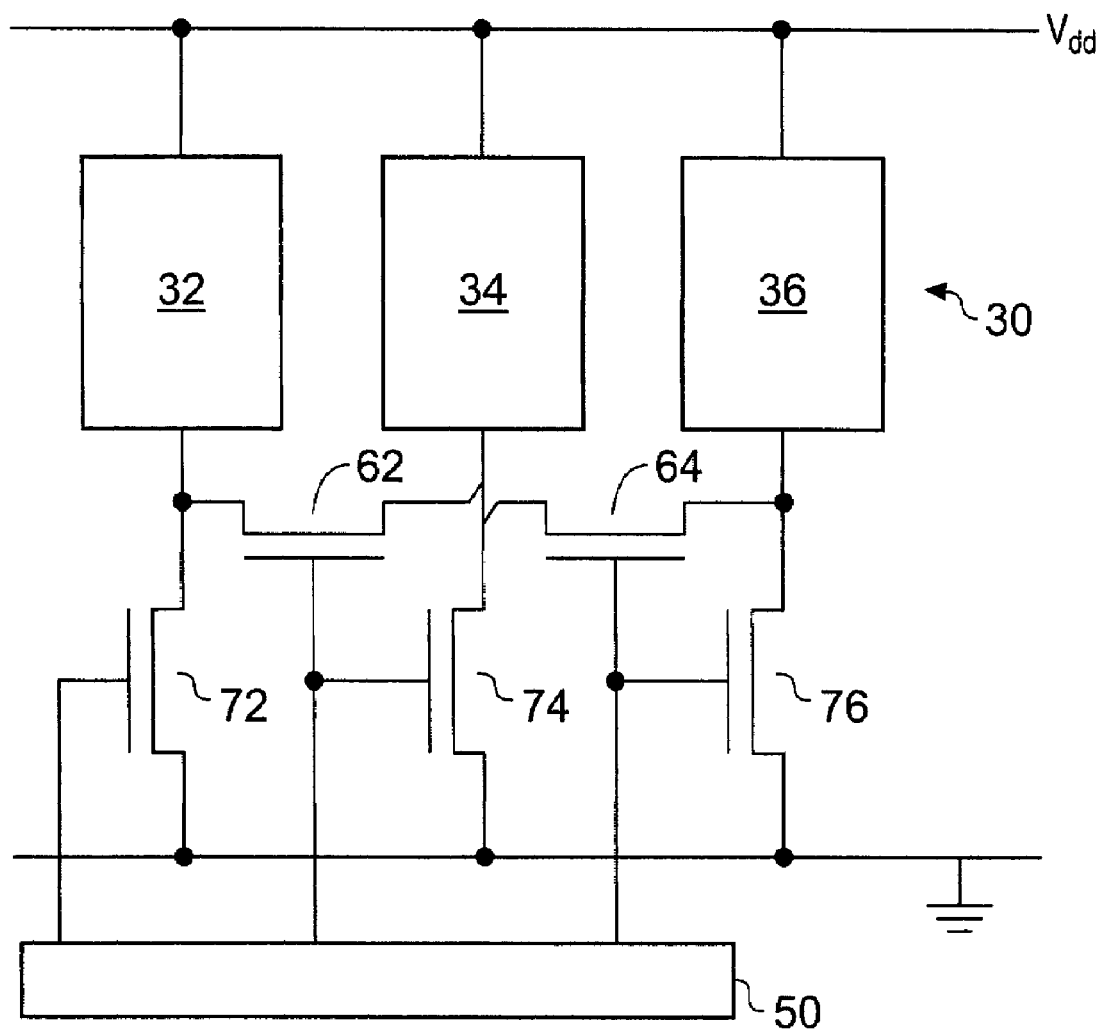
FIG. 3 shows a power gated circuit similar to the circuit of FIG. 1b but with footer power gating.

FIG. 3 shows an alternative embodiment of the present invention where circuitry 30 is power gated using footer devices 72, 74 and 76. These footer devices are NMOS power transistors and are similar to the PMOS power transistors of the circuit of FIG. 1b. Corresponding equalisation transistors 62 and 64 are provided to equalize current flow between these power transistors when they are switched on.

Figure 4:
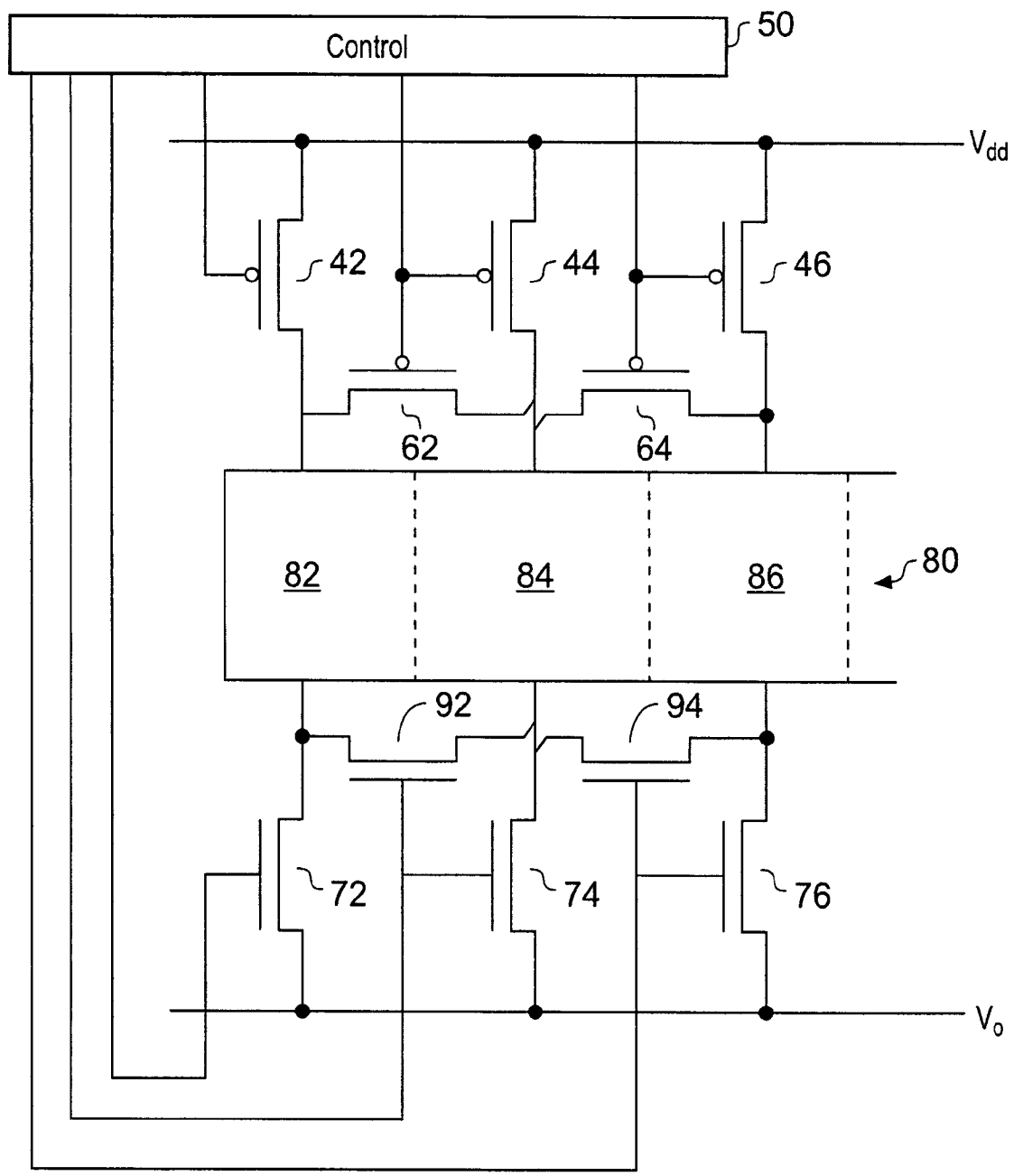
FIG. 4 shows a RAM circuit power gated by both headers and footers according to an embodiment of the present invention.

FIG. 4 shows a RAM circuit 80 in which the different columns 82, 84, 86 of the RAM are individually power gated under control of control logic 50. This RAM device is power gated using both header and footer transistors. The use of both headers and footers reduces power leakage when the RAM 80 is switched off. These headers and footers are controlled by control logic 50. The header gating transistor 42 to portion 82 is switched on at the same time as the footer power transistor 72 to this portion thereby turning the first column in the RAM 82 on. Next a control signal is sent to power transistors 44 and 74 and the same control signal is sent to equalisation devices 62 and 92. Thus, a single control signal is used to switch both the power transistors in the headers and footers and their equalisation devices. Clearly different control signals could be used but it is efficient to use a single signal and in this case it is appropriate to do so, as the equalisation devices should be switched on when the two power transistors to which they are connected are both turned on.

It should be noted that although the power gating devices are shown as either PMOS or NMOS power transistors in the above embodiments it should be clear to a skilled person that any appropriate switching device could be used. Furthermore, although in some embodiments it may be advantageous to use these PMOS or NMOS transistors as the equalisation devices, other switching devices such as a pass gate could also be used.

A skilled person would also appreciate, that although these equalisation devices are particularly applicable to circuits that are divided into portions and powered up sequentially they would also be appropriate to use in other power gated arrangements in which different portions are power gated by different devices. Equalisation between the power gating devices using a switching device which can be switched when both power gating devices are on will provide an additional path through which current can flow which will help alleviate any differences in voltage or current levels provided by what are in effect different virtual power supplies.

Figure 5:
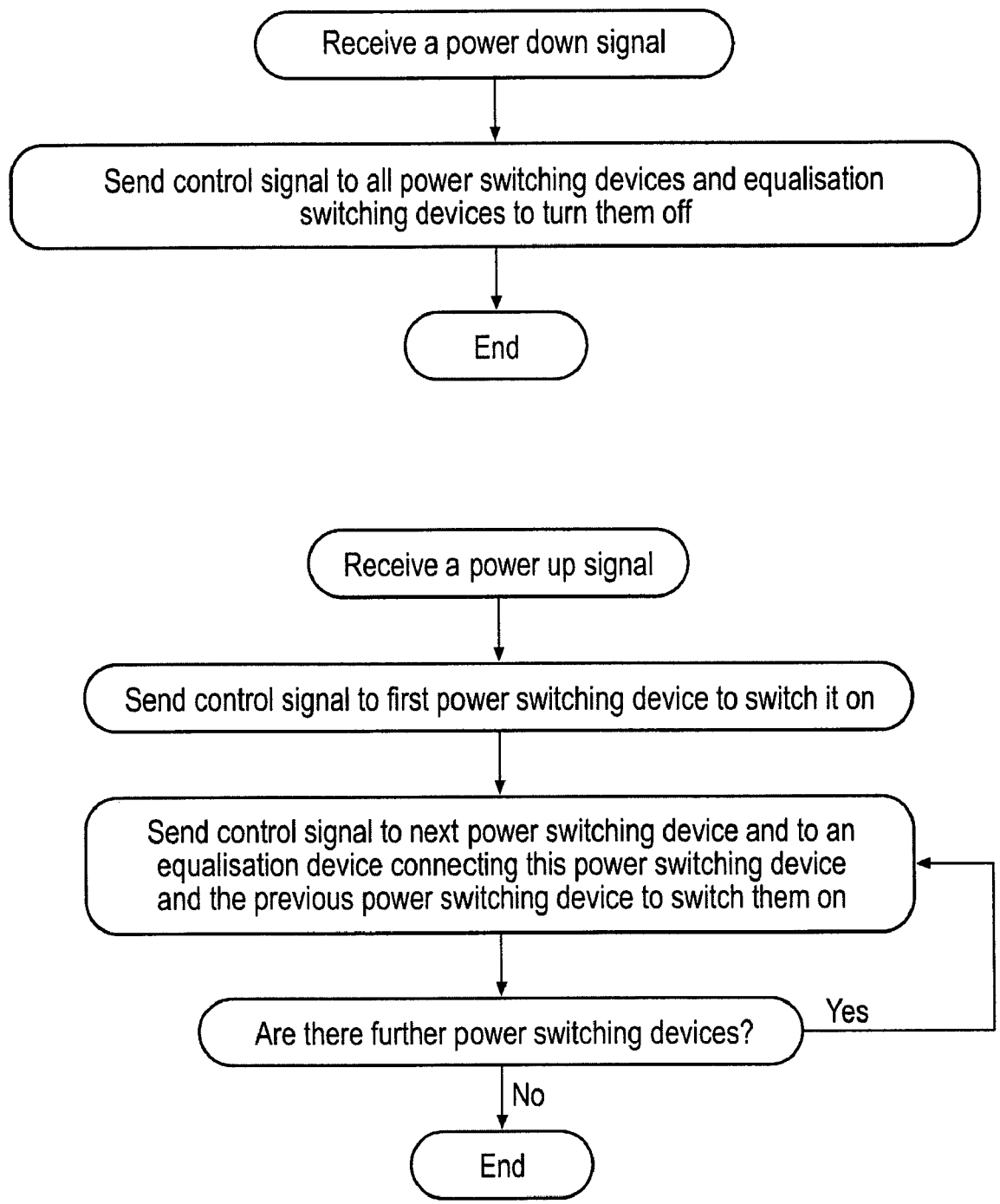
FIG. 5 shows the switching on and off of the circuitry according to an embodiment of the present invention.

FIG. 5 shows a flow diagram illustrating the switching off and the switching on of circuitry gated by a plurality of power switching devices according to an embodiment of the present invention. To switch the circuitry off, a power down signal is received and a control signal is sent to all power switching and equalisation switching devices to switch them off, whereupon they each provide a high resistance path thereby isolating the circuitry from at least one of the power rails.

To switch the circuitry back on, several control signals are sent. A signal is sent to a first power switching device and this is turned on, thereby providing a low resistance path, and enabling the portion of circuitry that it connects to, to be connected to the power rails and be powered up. A next signal is then sent to the next power switching device and to an equalisation device between the two power switching devices so that they are both turned on and provide low resistance paths. Thus, there is now a path from the power rails to the second circuit portion via the second switching device and via the first switching device and the voltage equalisation device. Similarly there is a path from the power rails to the first circuit portion via the first switching device, the voltage equalisation switching device and the second switching device. Thus, the first and second circuit portions can receive voltage and current from the power rails and are thus, switched on. Furthermore, several potential paths for this current to flow are provided thereby helping to compensate for any manufacturing differences in the first and second switching device.

This sequence of switching then proceeds for subsequent switching devices and circuit portions until all of the circuitry is powered up.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A control device for controlling power supplied to circuitry, said circuitry comprising a plurality of portions, each of said plurality of circuit portions being arranged between a first voltage level source and a second voltage level source, said first and second voltage level sources being adapted to output different voltage levels; said control device being adapted to control power supplied to each of said plurality of circuit portions, said control device comprising:
   a plurality of power switching devices corresponding to said plurality of circuit portions, each power switching device being arranged between said first voltage level source and a corresponding circuit portion such that when one of said plurality of power switching devices is switched on a voltage level close to a voltage level output by said first voltage level source is supplied to said corresponding circuit portion and said corresponding circuit portion is powered up and when switched off said corresponding circuit portion is isolated from said first voltage level source and said corresponding circuit portion is powered down; and
   at least one voltage equalisation switching device arranged between at least two of said power switching devices to provide a low resistance path between said at least two of said power switching devices when they are both turned on and to isolate said at least two of said power switching devices from each other when either is turned off.

2. A control device according to claim 1, wherein said control device is responsive to a power down signal to switch said plurality of power switching devices off at substantially a same time and is responsive to a power up signal to sequentially switch said power switching devices on, such that said power switching devices are switched on one after another in a predetermined switch on cycle.

3. A control device according to claim 2, said control device further comprising a plurality of voltage equalisation switching devices, said plurality of voltage equalisation switching devices being arranged between power switching devices temporally adjacent to each other in said switch on cycle.

4. A control device according to claim 3, wherein said power switching devices temporally adjacent to each other in said switch on cycle are arranged physically adjacent to each other within said control device.

5. A control device according to claim 3, said control device being arranged such that a control signal for switching a power switching device is also sent to a voltage equalisation switching device connecting said power switching device to a power switching device that switches on immediately prior to said power switching device in said switch on cycle, such that said voltage equalisation switching device switches at substantially a same time as said power switching device, thereby providing a low resistance path between power switching devices that are switched on.

6. A control device according to claim 1, wherein said power switching devices and voltage equalisation devices are the same type of switching devices.

7. A control device according to claim 1, wherein said power switching device comprises a power transistor.

8. A control device according to claim 7, wherein said power transistor comprises a PMOS transistor and said first voltage level source provides a higher voltage level than said second voltage level source.

9. A control device according to claim 8, wherein said voltage equalisation switching device comprises a PMOS transistor.

10. A control device according to claim 7, wherein said power transistor is an NMOS transistor and said first voltage level source provides a lower voltage level than said second voltage level source.

11. A control device according to claim 10, wherein said voltage equalisation switching device comprises an NMOS transistor.

12. A control device according to claim 1, said control device comprising a further plurality of power switching devices corresponding to said plurality of circuit portions, each of said further plurality of power switching devices being arranged between said second voltage level source and a corresponding circuit portion such that when one of said further plurality of power switching devices is switched on a voltage level close to a voltage level output by said second voltage level source is supplied to said corresponding circuit portion and if a corresponding power transistor connected between said first voltage level source and said circuit portion is switched on said corresponding circuit portion is powered up and when one of said further power switching devices is switched off said corresponding circuit portion is isolated from said second voltage level source and said corresponding circuit portion is powered down, said control device further comprising:
   at least one voltage equalisation switching device arranged between two of said further power switching devices to provide a low resistance path between said two further power switching devices when they are both turned on and to isolate said two further power switching devices from each other when either are turned off.

13. An integrated circuit comprising a first voltage source and a second voltage source, circuitry arranged between said first and second voltage sources, said circuitry comprising a plurality of portions, and a control device according to claim 1 for controlling power supplied to said plurality of circuit portions.

14. An integrated circuit according to claim 13, wherein said control device is responsive to a power down signal to switch said plurality of power switching devices off at substantially a same time and is responsive to a power up signal to sequentially switch said power switching devices on, such that said power switching devices are switched on one after another in a predetermined switch on cycle, said control device further comprising a plurality of voltage equalisation switching devices, said plurality of voltage equalisation switching devices being arranged between power switching devices temporally adjacent to each other in said switch on cycle wherein said power switching devices temporally adjacent to each other in said switch on cycle are arranged physically adjacent to each other within said control device and said corresponding circuit portions are arranged physically adjacent to each other within said circuitry.

15. An integrated circuit according to claim 13, said circuitry comprising an SRAM wherein each of said plurality of circuit portions comprising at least one column of said SRAM.

16. A method of controlling power supplied to circuitry, said circuitry comprising a plurality of portions, each of said plurality of circuit portions being arranged between a first voltage level source and a second voltage level source, said first and second voltage level sources being adapted to output different voltage levels;

said method comprising:

controlling a plurality of power switching devices corresponding to said plurality of circuit portions, each power switching device being arranged between said first voltage level source and a corresponding circuit portion, to turn on and thereby power up said corresponding circuit portion or to turn off and thereby power down said corresponding circuit portion; and controlling at least one voltage equalisation switching device arranged between at least two of said power switching devices to provide a low resistance path between said at least two of said power switching devices when they are both turned on and to isolate said at least two of said power switching devices from each other when either is turned off.

17. A method according to claim 16, wherein said method comprises powering said plurality of circuit portions down by:

substantially simultaneously switching said plurality of power switching devices off such that said corresponding plurality of circuit portions are powered down at substantially a same time; and powering said plurality of circuit portions up by:

sequentially switching said plurality of power switching devices on such that said corresponding plurality of circuit portions are powered up on one after another in a predetermined switch on cycle and at a same time switching a voltage equalisation device connecting a power switching device that is being turned on to a power switching device immediately preceding it in said switch on cycle to provide a low resistance path between said switched on power switching devices.

18. A means for controlling power supplied to circuitry, said circuitry comprising a plurality of portions, each of said plurality of circuit portions being arranged between a first voltage level source and a second voltage level source, said first and second voltage level sources being adapted to output different voltage levels; said means for controlling being for controlling power supplied to each of said plurality of circuit portions, and comprising:

a plurality of power switching means corresponding to said plurality of circuit portions for switching said plurality of circuit portions on or off, each power switching means being arranged between said first voltage level source and a corresponding circuit portion such that when one of said plurality of power switching means is switched on a voltage level close to a voltage level output by said first voltage level source is supplied to said corresponding circuit portion and said corresponding circuit portion is powered up and when switched off said corresponding circuit portion is isolated from said first voltage level source and said corresponding circuit portion is powered down; and at least one voltage equalisation switching means arranged between at least two of said power switching devices for providing a low resistance path between said at least two of said power switching means when they are both turned on and for isolating said at least two of said power switching means from each other when either is turned off.

* * * * *